US009398651B2

(12) United States Patent
Shrotriya et al.

(10) Patent No.: US 9,398,651 B2
(45) Date of Patent: Jul. 19, 2016

(54) CONTROLLER FOR INSERTING SIGNALING TRANSITIONS ONTO A LINE VOLTAGE

(71) Applicant: KONINKLIJKE PHILIPS N.V., Eindhoven (NL)

(72) Inventors: Ameya Dilip Shrotriya, Rosemont, IL (US); Nicholaos Hillas, Willowbrook, IL (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/761,436

(22) PCT Filed: Jan. 2, 2014

(86) PCT No.: PCT/IB2014/058013
§ 371 (c)(1),
(2) Date: Jul. 16, 2015

(87) PCT Pub. No.: WO2014/111820
PCT Pub. Date: Jul. 24, 2014

(65) Prior Publication Data
US 2015/0366013 A1    Dec. 17, 2015

Related U.S. Application Data

(60) Provisional application No. 61/753,507, filed on Jan. 17, 2013.

(51) Int. Cl.
*H05B 33/08*    (2006.01)
*H05B 37/02*    (2006.01)
(Continued)

(52) U.S. Cl.
CPC ........... *H05B 33/0815* (2013.01); *H03K 17/56* (2013.01); *H05B 33/0845* (2013.01);
(Continued)

(58) Field of Classification Search
CPC .......... H05B 33/0815; H05B 33/0845; H05B 41/40; H05B 41/42; H05B 41/3924; H05B 41/39
USPC .............................. 315/291, 307, 219, 209 R
See application file for complete search history.

(56) References Cited

U.S. PATENT DOCUMENTS 4,197,485 A * 4/1980 Nuver ................ H05B 41/3924
250/551
5,811,939 A   9/1998 Herniak
(Continued)

FOREIGN PATENT DOCUMENTS

CA    WO 2004114726 A1 * 12/2004 ............ H05B 41/40
JP    2010205733    9/2010
(Continued)

*Primary Examiner* — Douglas W Owens
*Assistant Examiner* — Syed M Kaiser
(74) *Attorney, Agent, or Firm* — Meenakshy Chakravorty

(57) ABSTRACT

A controller connected to a line voltage, includes an auto-transformer that provides a nominal line voltage at a first end terminal and a signaling voltage at a transformer tap. A first switch has a first switch terminal connected to the first end terminal of the auto-transformer, and a second switch terminal connected to an output node of the controller. A second switch has a first switch terminal connected to the transformer tap of the auto-transformer, and a second switch terminal connected to the output node. A switch controller is configured to output first and second switch signals responsive to a control signal, to control the first and second switches to insert signaling transitions onto the line voltage by selectively connecting the nominal line voltage at the first end terminal and the signaling voltage at the transformer tap to the output node.

20 Claims, 5 Drawing Sheets

(51) Int. Cl.
*H05B 41/392* (2006.01)
*H03K 17/56* (2006.01)

(52) U.S. Cl.
CPC ........ *H05B33/0896* (2013.01); *H05B 37/0263* (2013.01); *H05B 37/0272* (2013.01); *H05B 37/0281* (2013.01); *H05B 41/3927* (2013.01); *Y02B 20/42* (2013.01)

(56) References Cited

U.S. PATENT DOCUMENTS

| | | | |
|---|---|---|---|
| 6,078,146 A | 6/2000 | Reverberi | |
| 6,078,148 A | 6/2000 | Hochstein | |
| 6,191,568 B1 | 2/2001 | Poletti | |
| 7,196,478 B2 * | 3/2007 | Dijkstra | H05B 41/3924 250/504 R |
| 7,436,129 B2 * | 10/2008 | Olson | G09G 3/3406 315/224 |
| 8,427,074 B1 | 4/2013 | Xiong | |
| 2002/0097007 A1 * | 7/2002 | Koncz | H05B 41/3924 315/291 |
| 2003/0173906 A1 * | 9/2003 | Lee | H05B 41/3924 315/219 |
| 2009/0295300 A1 * | 12/2009 | King | H05B 33/0815 315/209 R |
| 2010/0060179 A1 * | 3/2010 | Newman, Jr. | H05B 41/295 315/219 |
| 2010/0060186 A1 * | 3/2010 | Taipale | H05B 41/2822 315/291 |

FOREIGN PATENT DOCUMENTS

| | | | |
|---|---|---|---|
| WO | 2004114726 A1 | 12/2004 | |
| WO | 2011024101 A1 | 3/2011 | |
| WO | WO 2011024101 A1 * | 3/2011 | ......... H05B 33/0815 |

* cited by examiner

CONTROLLER FOR INSERTING SIGNALING TRANSITIONS ONTO A LINE VOLTAGE

CROSS-REFERENCE TO PRIOR APPLICATIONS

This application is the U.S. National Phase application under 35 U.S.C. §371 of International Application No. PCT/IB2014/058013, filed on Jan. 2, 2014, which claims the benefit of U.S. Provisional Patent Application No. 61/753,507, filed on Jan. 17, 2013. These applications are hereby incorporated by reference herein.

TECHNICAL FIELD

The present invention is directed generally to a controller for inserting signaling transitions onto a line voltage. More particularly, various inventive apparatuses disclosed herein relate to a controller and lighting system for inserting signaling transitions onto a line voltage to control the dimming level of lighting sources.

BACKGROUND

Many lighting applications make use of dimmers. Dimming may be achieved by means of standard control interfaces such as a digitally addressable lighting interface (DALI), a digital multiplex (DMX) interface or 0-10V dimming interface, or by line-side control methods such as leading-edge and trailing-edge dimming schemes and a power-line communication scheme. Although well established, each of these interfaces and schemes have limitations and undesirable characteristics.

For example, control interface standards such as DALI, DMX or 0-10V require installation of control lines in addition to power lines. Most existing lighting infrastructure, particularly outdoor lighting infrastructure, is designed for use with conventional lighting sources and does not support additional control wiring. Also, such control interfaces necessitate the use of a controller located either remotely or at every lighting source. Isolation and safety are concerns.

Line-side control methods alleviate the need of control lines. However, leading-edge dimming (triac dimming) or forward-phase dimming schemes chop a leading-edge portion of the voltage signal waveform, and trailing-edge dimming or reverse-phase dimming schemes chop trailing edge portions of the voltage signal waveform. Consequently, it is difficult to meet power factor and total harmonic distortion (THD) requirements with these dimming schemes. The dimming percentage is limited and the hardware necessary to implement these schemes is complicated. Power-line communication schemes add noise to the power line, resulting in transmission of electromagnetic interference on the power lines.

Thus, it would be desirable to provide a lighting driver and line-side dimming scheme that adjusts the dimming level of lighting sources without the use or installation of control wires and standard line-side dimming schemes, and that may be easily installed and implemented in existing lighting infrastructure.

SUMMARY

The present disclosure is directed to inventive apparatuses for inserting signaling transitions onto a line voltage to control the dimming level of a lighting source.

Generally, in one aspect, the invention generally relates to a controller for inserting signaling transitions onto a line voltage that includes an auto-transformer having first and second end terminals, and is configured to include a first winding portion connected between the first end terminal and a transformer tap, and a second winding portion connected between the transformer tap and the second end terminal, the first and second end terminals connected to the line voltage; a first switch having a first switch terminal connected to the first end terminal of the auto-transformer, and a second switch terminal connected to an output node of the controller; a second switch having a first switch terminal connected to the transformer tap of the auto-transformer, and a second switch terminal connected to the output node; and a switch controller configured to output first and second switch signals responsive to a control signal, to control the first and second switches to insert the signaling transitions onto the line voltage by selectively connecting a nominal line voltage at the first end terminal and a signaling voltage at the transformer tap to the output node.

In another aspect, the invention generally relates to a lighting system that includes a controller connectable to a line voltage, and configured to insert signaling transitions that transition between a nominal line voltage and a signaling voltage onto the line voltage responsive to a control signal; and at least one lighting unit connected to the line voltage having the signaling transitions, and configured to control dimming level of emitted light responsive to the signaling transitions.

In yet another aspect, a controller for inserting transitions into a line voltage includes an auto-transformer connected to the line voltage, and configured to respectively provide a nominal line voltage and a signaling voltage at a first end terminal and a transformer tap; a switch connected between the auto-transformer and an output node of the controller; and a switch controller configured to control the switch to insert the signaling transitions onto the line voltage by selectively connecting the nominal line voltage at the first end terminal and the signaling voltage at the transformer tap to the output node, the signaling transitions including a plurality of first transitions having a predetermined first time interval between each other that set the start of a signaling mode, and a second transition after the plurality of first transitions, a time interval between the second transition and a last of the plurality of first transitions set responsive to a value of the control signal to control dimming level of at least one lighting unit connected to the controller.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers).

For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

The term "lighting fixture" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources such as one or more strings of LEDs as discussed above, alone or in combination with other non LED-based light sources. A "multi-channel" lighting unit refers to an LED-based or non LED-based lighting unit that includes at least two light sources configured to respectively generate different spectrums of radiation, wherein each different source spectrum may be referred to as a "channel" of the multi-channel lighting unit.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers.

The term "addressable" is used herein to refer to a device (e.g., a light source in general, a lighting unit or fixture, a controller or processor associated with one or more light sources or lighting units, other non-lighting related devices, etc.) that is configured to receive information (e.g., data) intended for multiple devices, including itself, and to selectively respond to particular information intended for it. The term "addressable" often is used in connection with a networked environment (or a "network," discussed further below), in which multiple devices are coupled together via some communications medium or media.

In one network implementation, one or more devices coupled to a network may serve as a controller for one or more other devices coupled to the network (e.g., in a master/slave relationship). In another implementation, a networked environment may include one or more dedicated controllers that are configured to control one or more of the devices coupled to the network. Generally, multiple devices may be coupled to some network and each may have access to data that is present on the communications medium or media; however, a given device may be "addressable" in that it is configured to selectively exchange data with (i.e., receive data from and/or transmit data to) the network, based, for example, on one or more particular identifiers (e.g., "addresses") assigned to it.

The term "network" as used herein refers to any interconnection of two or more devices (including controllers or processors) that facilitates the transport of information (e.g. for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present disclosure, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection).

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the draw

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Figure 1:
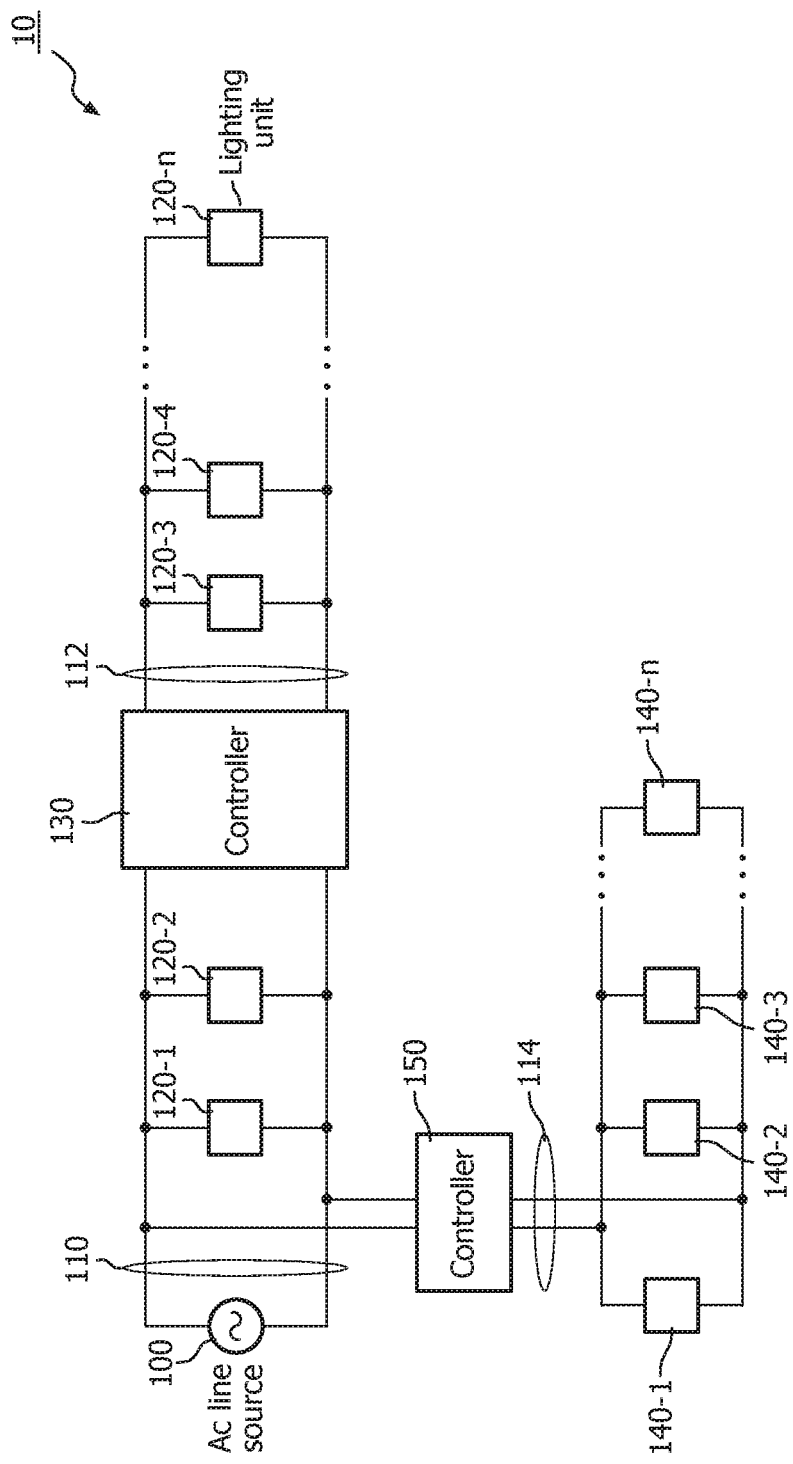
- FIG. 1 illustrates an example embodiment of a lighting system including controllers that control the dimming levels of lighting units.

FIG. 1 illustrates an example embodiment of a lighting system including controllers that control the dimming level of lighting units. Lighting system 10 includes an AC line source 100 which may be connected to a plurality of lighting units 120-1 and 120-2 and to controllers 130 and 150 by a cable 110 consisting of two wires. Controller 130 may be connected to a plurality of lighting units 120-3, 120-4, . . . 120-n via cable 112 which may consist of two wires. Controller 150 may be connected to a plurality of lighting units 140-1, 140-2, 140-3, . . . 140-n by a cable 114 which may consist of two wires. AC line source 100 may be mains voltage. In some embodiments AC line source 100 may provide 120 volts AC, 277 volts AC, or other values of AC voltage. Each of lighting units 120-1-120-n and 140-1-140-n may include one or more lighting sources. Each of lighting units 120-1-120-n and 140-1-140-n may also include one or more corresponding lighting drivers (ballasts) for driving the lighting sources.

Controllers 130 and 150 insert bursts of signaling transitions onto the line voltage provided from AC line source 100 via cable 110, to control the dimming level of the subsequently disposed lighting fixtures. The signaling transitions transition between a nominal line voltage and a signaling voltage. Controller 130 outputs the line voltage having signaling transitions inserted thereon along cable 112 to control the dimming level of lighting units 120-3, 120-4, . . . 120-n. Controller 150 outputs the line voltage having signaling transitions inserted thereon along cable 114 to control the dimming level of lighting units 140-1, 140-2, 140-3, . . . 140-n. As will be subsequently described, one or more of lighting units 120-3, 120-4, . . . 120-n disposed downstream relative to controller 130 and/or one or more of lighting units 140-1, 140-2, 140-3, . . . 140-n disposed downstream relative to controller 150 may include lighting drivers configured to detect the inserted signaling transitions and control the dimming level of the corresponding lighting sources responsive to the discriminated signaling transitions. That is, one or more of lighting units 120-3, 120-4, . . . 120-n disposed downstream relative to controller 130 and/or one or more of lighting units 140-1, 140-2, 140-3, . . . 140-n disposed downstream relative to controller 150 may not include lighting drivers configured to detect inserted signaling transitions, while other ones of the lighting units may include lighting drivers configured to detect signaling transitions. Lighting units that do not include lighting drivers configured to detect the signaling transitions will be unaffected by the inserted signaling transitions, and the dimming level of such lighting units will not be controllable. Lighting units 120-1 and 120-2 may or may not be configured as including lighting drivers configured to detect signaling transitions. However, since lighting units 120-1 and 120-2 are disposed upstream relative to controllers 130 and 150 so that the line voltage is provided directly from AC line source 100 without inserted signaling transitions, the dimming level of lighting units 120-1 and 120-2 are not controlled in this embodiment.

Although only two controllers 130 and 150 are shown, in other embodiments a plurality of additional controllers may be disposed in lighting system 10 to control various other lighting units. Also, in other embodiments all of the lighting units may include lighting drivers configured to discriminate inserted signaling transitions, and all of the lighting units may be disposed downstream relative to a controller configured to insert signaling transitions for controlling dimming level. In some embodiments, the lighting units including lighting drivers configured to detect signaling transitions for controlling dimming level may be connected in parallel to a controller such as controller 130, and will thus be responsive to signaling transitions inserted by controller 130. The configuration of lighting system 10 is merely exemplary. Lighting system 10 may include lighting units disposed to illuminate streets or highways, to provide general lighting within an outdoor facility, to provide exterior security lighting and/or to provide general lighting indoors within a facility. Plural controllers such as controllers 130 and 150 may be provided in a variety of locations including on outdoor structures or poles on which lighting units are mounted, and/or at various locations within an indoor facility such as at opposite ends of a large storage area, and/or at various control locations.

Figure 2:
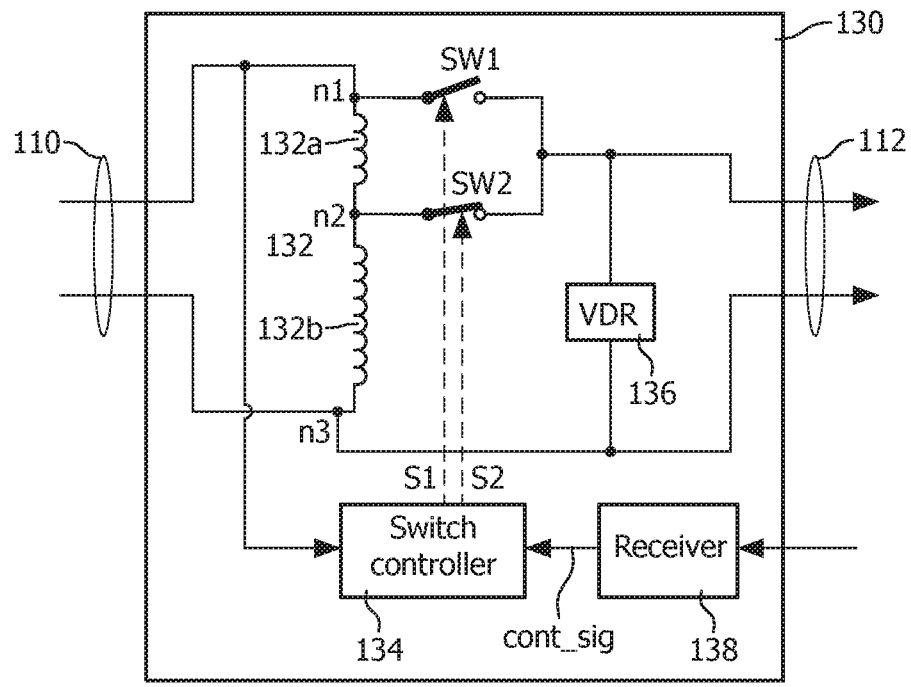
FIG. 2 illustrates an example embodiment of a controller of the lighting system.

FIG. 2 illustrates an example embodiment of a controller of the lighting system. As shown in FIG. 2, controller 130 is connectable to the line voltage provided by AC line source 100 via cable 110, and is configured to insert signaling transitions onto the line voltage and to provide the line voltage having the signaling transitions inserted thereon to lighting units 120-3, 120-4, . . . 120-n via cable 112. Controller 130 includes an auto-transformer 132 having a first end terminal n1 connected to a first wire of cable 110, a second end terminal n3 connected to a second wire of cable 110, a first winding portion 132a connected between first end terminal n1 and transformer tap n2, and a second winding portion 132b connected between transformer tap n2 and second end terminal n3. Switch SW1 (first switch) includes a first switch terminal connected to first end terminal n1, and a second switch terminal connected to node n9. Node n9 is connected to the first wire of cable 112, and may be characterized as an output node of controller 130. Switch SW2 (second switch) includes a first switch terminal connected to transformer tap n2, and a second switch terminal connected to node n9. Switches SW1 and SW2 may be relays, solid-state relays having extremely fast response time, thyristors or insulated gate bipolar transistors (IGBTs). If a high power rating is necessary, switches SW1 and SW2 may consist of solid-state relays which engage respective power relays scaled to handle the appropriate power levels. The second wire of cable 112 is connected to second end terminal n3 of auto-transformer 132.

Switch controller 134 is connected to the first wire of cable 110 and is powered by the line voltage. Switch controller 134 provides switch signal s1 (a first switch signal) for turning switch SW1 on/off, and switch signal s2 (a second switch signal) for turning switch SW2 off/on. Switch signals s1 and s2 are output by switch controller 134 so that switches SW1 and SW2 are respectively in an on state and an off state simultaneously, or respectively in an off state and an on state simultaneously. Switches SW1 and SW2 may be together characterized as a switch that is responsive to switch signals s1 and s2 which may in turn be together characterized as a switch signal. Although switches SW1 and SW2 may be simultaneously in an off state cutting off supply of the line voltage to cable 112, to prevent shorting of auto-transformer 132 switch controller 134 controls switch signals s1 and s2 so that switches SW1 and SW2 are not simultaneously in an on state. Switch controller 134 controls the on/off timing of switches SW1 and SW2 to insert signaling transitions onto the line voltage output to cable 112, responsive to control signal cont_sig. As will be described, switch controller 134 controls switches SW1 (first switch) and SW2 (second switch) to insert signaling transitions onto the line voltage by selectively connecting a nominal line voltage at first end terminal n1 and a signaling voltage at transformer tap n2 to output node n9. Switch controller 134 may include a microcontroller, an application-specific integrated circuit (ASIC), a field programmable gate array (FPGA), or any circuitry capable of generating switch signals s1 and s2.

In an embodiment, controller 130 may further include receiver 138 configured to receive an externally provided wireless signal from a server or central control unit, the wireless signal indicative of a desired dimming level of lighting units 120-3, 120-4, . . . 120-n controlled by controller 130. The externally provided wireless signal may be a radio frequency (RF) signal such as a general packet radio service (GPRS) signal, an optical signal, or any wireless signal. In a further embodiments, controller 130 may be hardwired to directly receive control signal cont_sig indicative of the desired dimming level of lighting units 120-3, 120-4, . . . 120-n. For example, control signal cont_sig may be provided manually by a user as a voltage level input from a potentiometer, a wall mounted dimmer or a switch disposed separately from controller 130. The voltage level may be input directly to an analog-digital converter (ADC) input terminal of switch controller 134. In such further embodiments, receiver 138 may be unnecessary and thus omitted from switch controller 134.

Controller 130 may further include a voltage dependent resistor (VDR) or varistor 136 as a protective element. VDR 136 has a first terminal connected to the first wire of cable 112 and the second switch terminals of switches SW1 and SW2, and also has a second terminal connected to the second wire of cable 112 and second end terminal n3 of auto-transformer 132. Controller 130 may be configured to provide switch signals s1 and s2 to insert the signaling transitions onto the line voltage by turning switches SW1 and SW2 on and off for short periods of time on the order of several msecs or a few tens of msecs. VDR 136 clamps the peak voltage provided to the wires of cable 112 by absorbing transient energy arising from voltage spikes introduced by switching of winding portions 132a and 132b, to prevent damage to downstream lighting units 120-3, 120-4, . . . 120-n. In other embodiments, VDRs may be disposed in the front end of lighting units 120-3, 120-4, . . . 120-n instead of in controller 130, or VDRs may be disposed in both the front end of lighting units 120-3, 120-4, . . . 120-n and in controller 130.

While the configuration of controller 130 has been described above in detail with respect to FIG. 2, controller 150 may be configured in a similar manner. Controller 150 is connected to the line voltage provided by AC line source 100 via cable 110, and may be configured to insert signaling transitions onto the line voltage and to provide the line voltage as having the signaling transitions inserted thereon to lighting units 140-1, 140-2, 140-3, . . . 140-n via cable 114.

Figure 3:
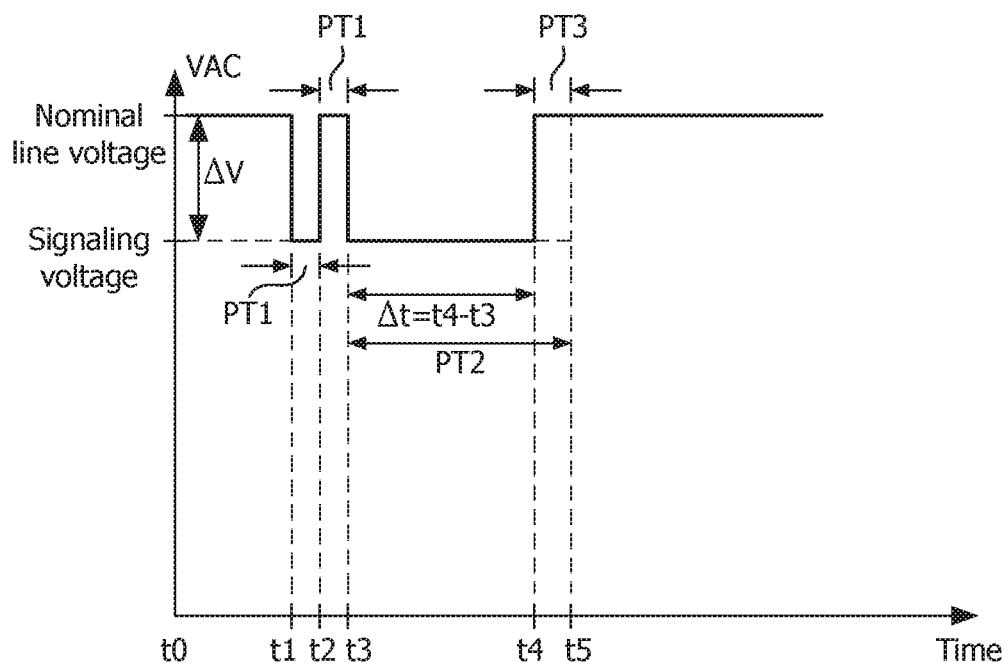
FIG. 3 illustrates an example embodiment of the line voltage having inserted signaling transitions.

FIG. 3 illustrates an embodiment of the line voltage having inserted signaling transitions, as output by the controller. The signaling transitions, and the manner in which they are inserted onto the line voltage by controller 130 to control the dimming level of lighting units 120-3, 120-4, . . . 120-n will be described with reference to FIGS. 1-3. The following is also descriptive of the line voltage with inserted signaling transitions as output by controller 150 to control the dimming level of lighting units 140-1, 140-2, 140-3, . . . 140-n.

At some time t0 shown in FIG. 3, AC line source 100 may be operative to provide a line voltage of 120 volts AC to lighting units 120-1 and 120-2 and to controllers 130 and 150 via cable 110. Lighting units 120-1 and 120-2 as directly provided with the line voltage from AC line source 100 without signaling transitions will be maintained on responsive to the provided line voltage without dimming control.

At time t0 there is no signaling to control dimming level, and switch controller 134 within controller 130 outputs switch signals s1 and s2 to respectively close switch SW1 and to open switch SW2, so that the first and second wires of cable 112 are respectively connected to first and second end terminals n1 and n3 of auto-transformer 132. The line voltage of 120 volts AC from cable 110 is thus output to cable 112 and provided to lighting units 120-3, 120-4, . . . 120-n which are maintained on without dimming. Subsequently at time t1, responsive to control signal cont_sig indicative of a desired dimming level of corresponding lighting units 120-3, 120-4, . . . 120-n, switch controller 134 outputs switch signals s1 and s2 to respectively open switch SW1 and close switch SW2, so that the first and second wires of cable 112 are respectively connected to transformer tap n2 and second end terminal n3 of auto-transformer 132. The line voltage thus transitions from the nominal line voltage to a signaling voltage at time t1. This transition at time t1 may be characterized as a first transition.

In an embodiment, the signaling voltage may be set so that the value $\Delta V$ between the nominal line voltage and the signaling voltage as shown in FIG. 3 is large enough to be easily distinguishable over nominal line voltage fluctuations, but also small enough so that the signaling voltage is greater than the drop-out voltage of the lighting drivers within lighting units 120-1-120-n and 140-1-140-n. In some embodiments, the signaling voltage may be set to be a percentage of the nominal line voltage. The signaling voltage may be set to a fixed percentage within a range of about 90%-95% of the nominal line voltage. For a nominal line voltage of 120 volts AC, the signaling voltage may accordingly be set to be within a range of about 114 volts AC to 108 volts AC. In other embodiments, the signaling voltage may be set as other percentages of the nominal line voltage, such as 80% for example. Auto-transformer 132 within controller 130 is designed so that winding portions 132a and 132b have the necessary respective number of windings to provide the selected signaling voltage at transformer tap n2.

Returning to FIG. 3, after a predetermined first time interval PT1 has elapsed subsequent time t1, switch controller 134 outputs switch signals s1 and s2 to respectively close switch SW1 and open switch SW2 at time t2, so that the first and second wires of cable 112 are respectively connected to first and second end terminals n1 and n3 of auto-transformer 132 and so that the line voltage of 120 volts AC is again output to cable 112. The line voltage thus transitions from the signaling voltage to the nominal line voltage at time t2. This transition at time t2 may also be characterized as a first transition.

In some embodiments, the predetermined first time interval PT1 may be set as 20 msecs when the system is designed. In other embodiments different predetermined first time intervals PT1 may be set when the system is designed. The predetermined first time interval PT1 should however be set so that the response time of switches SW1 and SW2 is negligible compared to the predetermined first time interval PT1.

After a predetermined first time interval PT1 has elapsed subsequent time t2, switch controller 134 outputs switch signals s1 and s2 at time t3 to respectively open switch SW1 and close switch SW2, so that the first and second wires of cable 112 are respectively connected to transformer tap n2 and second end terminal n3 of auto-transformer 132. The line voltage thus again transitions from the nominal line voltage to the signaling voltage at time t3. This transition at time t3 may be characterized as another first transition.

As will be subsequently described, the lighting drivers within lighting units 120-3, 120-4, . . . 120-n subsequent controller 130 may be configured to enter a signaling mode upon detecting the above noted plurality of first transitions at times t1, t2 and t3 having the predetermined first time interval between each other. That is, the signaling mode begins at time t3. One of the reasons for having the time PT1 from time t2 to time t3 the same as the time PT1 from time t1 to time t2 is so that the lighting drivers can distinguish the signaling transitions from random line fluctuations in the same voltage range as the signaling voltage. This prevents false triggering of the signaling mode. If the time counted between voltage transitions detected by the lighting drivers at the lighting units does not match the predetermined time interval PT1, the lighting drivers will ignore the voltage transitions as random line fluctuations. Although three first transitions are described as indicating the start of the signaling mode, in other embodiments different numbers of first transitions greater than three, and/or transitions having four or more transitions may indicate the start of the signaling mode, and/or predetermined first time interval PT1 may be longer or shorter than 20 msecs as set during system design.

Upon entering the signaling mode, switch controller 134 of controller 130 determines a time interval $\Delta t$ corresponding to the desired dimming level of lighting units 120-3, 120-4, . . . 120-n as indicated by the received control signal cont_sig. After the determined time interval $\Delta t$ corresponding to the desired dimming level has elapsed subsequent occurrence of the last of the first transitions at time t3, switch controller 134 outputs switch signals s1 and s2 to respectively close switch SW1 and open switch SW2 at time t4. The first and second wires of cable 112 are respectively connected to first and second end terminals n1 and n3 of auto-transformer 132 at time t4 so that the line voltage of 120 volts AC is again output to cable 112. The line voltage thus transitions from the signaling voltage to the nominal line voltage at time t4. This transition at time t4 may be characterized as a second transition.

As shown in FIG. 3, the time interval $\Delta t$ between the second transition at time t4 and the last of the first transitions at time t3 is $\Delta t = t4 - t3$. The timing of the second transition at time t4 is determined by switch controller 134 responsive to the control signal cont_sig so that time interval $\Delta t$ between the second transition and a last of the plurality of first transitions is set to have a length corresponding to the desired dimming level. In some embodiments, the range of the time interval $\Delta t$ may be defined as 200 msecs ≤ $\Delta t$ ≤ 400 msecs, where a time interval $\Delta t$ of 200 msecs corresponds to a minimum dimming level (darkest) and a time interval $\Delta t$ of 400 msecs corresponds to a maximum dimming level (brightest). The range of time interval $\Delta t$ may be divided into discrete steps with each step representing a certain percentage of dimming level. Switch controller 134 may include a memory which stores or maps discrete time intervals $\Delta t$ for various desired dimming levels, and may be configured to provide switch signals s1 and s2 at a corresponding time t4 in accordance with the stored or mapped discrete time intervals $\Delta t$. In other embodiments, different ranges of time interval $\Delta t$ may be used. The range of time interval $\Delta t$ should however be at least 400 msecs.

As further shown in FIG. 3, subsequent the second transition at time t4, after the signaling mode is complete, the line voltage is indefinitely maintained at the nominal voltage level by switch controller 134 of controller 130, until a new control signal cont_sig is received indicative of a new desired dimming level. In the above noted example embodiment, in a case where the first predetermined time interval PT1 is set to 20 msecs and the time interval $\Delta t$ is a maximum of 400 msecs corresponding to a maximum dimming level, the line voltage is altered by the signaling transitions inserted at times t1-t4 over a very short period of time less than one second. During periods of time where the dimming level of the lighting units is to remain in a steady state, signaling transitions are not inserted by switching controller 134 and the line voltage remains unaltered at 120 volts AC. Dimming control can thus be provided and maintained using a single set of signaling transitions with minimum power consumption. As an error-detection method, the sequence of signaling transitions may be repeated once or twice in succession so that the lighting drivers within the lighting units may confirm that the same sequence of signaling transitions was repeated and therefore conclude that the sequence of signaling transitions was authentic. In further embodiments, time interval $\Delta t$ may represent a specific character, wherein a recurring string of such characters can be encoded onto the line voltage to represent a complex message or command.

In embodiments having a defined range of the time interval $\Delta t$ as noted above, the time interval $\Delta t$ may be set to a maximum time interval $\Delta t_{max}$ of 400 msecs corresponding to a maximum dimming level. In a further embodiment, switch controller 134 may be configured to enter a standby mode responsive to control signal cont_sig. Upon receipt of the control signal cont_sig indicative of the standby mode, instead of outputting switch signals s1 and s2 at time t4 to provide the second transition within the defined range of the time interval $\Delta t$ to be indicative of a corresponding dimming level, switch controller 134 outputs switch signals s1 and s2 after a predetermined second time interval PT2 has elapsed subsequent time t3 shown in FIG. 3. That is, switch signals s1 and s2 are instead output at time t5. The predetermined second time interval PT2 as shown in FIG. 3 may be defined as PT2 = $\Delta t_{max}$ + PT3, wherein assuming the above noted defined range of the time interval $\Delta t$, $\Delta t_{max}$ is 400 msecs and predetermined third time interval PT3 may be set as 20 msecs for example. That is, predetermined second time interval PT2 is set to be greater than $\Delta t_{max}$. Predetermined third time interval PT3 may be the same as or different in length than first predetermined time interval PT1.

The time interval $\Delta t$ may also represent a specific "character" and therefore, a recurring string of such "characters" can be encoded on the line voltage to constitute a complex message or command. Therefore, a protocol can be designed which will make use of the "channel" that we are providing through this patent.

The lighting drivers within lighting units 120-3, 120-4, ... 120-n subsequent controller 130 may be configured to enter the standby mode upon detecting the second transition depicted by dashed lines at time t5. In the standby mode, the lighting drivers within at least one of the lighting units may be controlled to no longer output driving current to the lighting sources so that the lighting sources no longer emit light and to also power down non-essential circuitry within the lighting drivers. In the standby mode, minimal circuitry necessary to receive and detect a next set of signaling transitions remain powered on. By provision of the standby mode the lighting sources may be shut off by powering down the lighting drivers instead of mechanically switching circuit breakers or relays, thus preventing excessive in-rush currents and significantly minimizing wear of the circuit breakers and relays.

Figure 4:
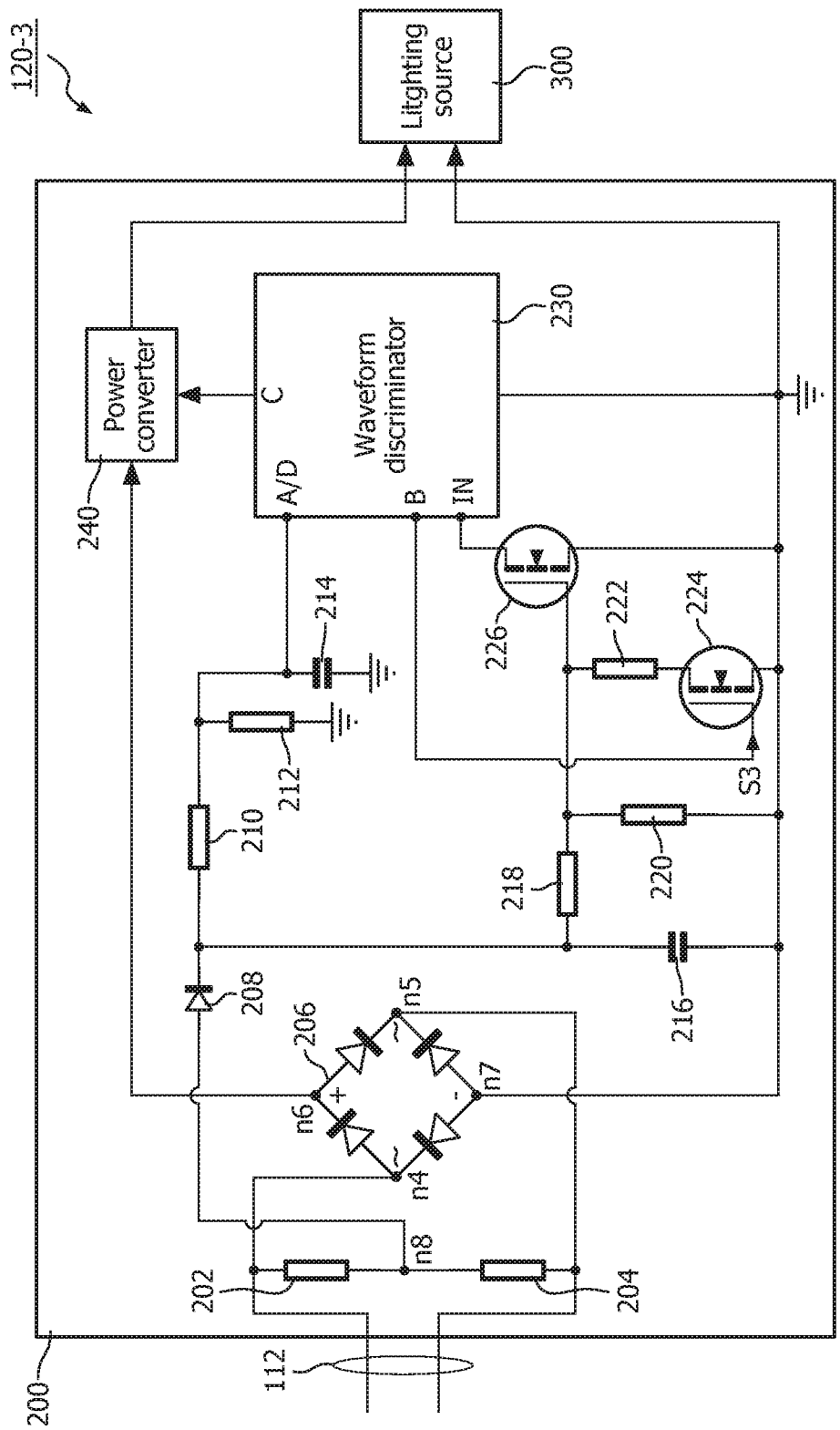
FIG. 4 illustrates an example embodiment of a lighting unit.

FIG. 4 illustrates an example embodiment of a lighting unit. Lighting unit 120-3 as shown in FIG. 4 may be representative of any of lighting units 120-1, 120-2, 120-4, ... 120-n and 140-1-140-n, and includes lighting driver 200 and lighting source 300. As described previously, each of the lighting units such as lighting unit 120-3 may include one or more lighting sources 300 and one or more lighting drivers 200. Lighting drivers 200 may be configured as subsequently described to detect signaling transitions inserted onto the line voltage. It should be understood that lighting driver 200 may include additional circuitry and components not described in the following. Lighting source 300 may be e-fluorescent lighting, e-HID (electronic-high intensity discharge) lighting, LED lighting, or any suitable lighting.

Lighting driver 200 as shown in FIG. 4 includes resistor 202 having a first terminal connected to a first wire of cable 112, and resistor 204 having first and second terminals respectively connected to a second terminal of resistor 202 and a second wire of cable 112. Resistors 202 and 204 are together configured as a resistive divider. Nodes n4 and n5 of full wave bridge rectifier 206 are respectively connected to the first wire of cable 112 and the second wire of cable 112. Nodes n6 and n7 of full wave bridge rectifier 206 are respectively connected to power converter 240 and the ground node. Diode 208 has an anode connected to node n8 between resistors 202 and 204, and a cathode connected to first terminal of capacitor 216. Capacitor 216 has a second terminal connected to the ground node. Resistor 210 has a first terminal connected to the cathode of diode 208. Resistor 212 has first and second terminals respectively connected to the second terminal of resistor 210 and to ground. Capacitor 214 has a first terminal connected to the first terminal of resistor 212 and to an input terminal A/D of waveform discriminator 230, and has a second terminal connected to ground. Resistors 210 and 212 are together configured as a resistive divider.

Resistor 218 has a first terminal connected to the first terminal of capacitor 216. Resistor 220 includes first and second terminals respectively connected to a second terminal of resistor 218 and the ground node. Resistor 222 has a first terminal connected to the second terminal of resistor 218. N-channel FET 224 has a gate terminal connected to output terminal B of waveform discriminator 230, a drain terminal connected to a second terminal of resistor 222, and a source terminal connected to the ground node. Resistors 218 and 220 are together configured as a resistive divider, and divide a detected peak voltage provided by diode 208. When n-channel FET 224 is turned on responsive to an output of waveform discriminator 230, resistor 222 is switched into connection in parallel with resistor 220. When n-channel FET 224 is turned off responsive to an output of waveform discriminator 230, resistor 222 is disconnected from the resistive divider including resistors 218 and 220. N-channel FET (transistor) 226 has a gate (first) terminal connected to the second terminal of transistor 218, a drain (third) terminal connected to input terminal IN of waveform discriminator 230, and a source (second) terminal connected to the ground node.

Waveform discriminator 230 is configured to provide a dimming control signal via output terminal C to power converter 240 responsive to the voltage level at the drain terminal of n-channel FET 226 connected to input terminal IN. Waveform discriminator 230 is also configured to provide a switching signal s3 via output terminal B to the gate terminal of n-channel FET 224 responsive to the voltage level at the first terminal of capacitor 214 connected to input terminal A/D. Waveform discriminator 230 is further connected to the ground node. Power converter 240 adjusts the intensity of lighting source 300 by adjusting the amount of current driven into lighting source 300 in response to the dimming control signal output from waveform discriminator 230.

In operation, full wave bridge rectifier 206 within lighting driver 200 of lighting unit 120-3 shown in FIG. 4 rectifies the line voltage applied via cable 112, and provides the rectified voltage to power converter 240 and to power waveform discriminator 230. The line voltage applied via cable 112 is also peak detected by diode (peak detector) 208, and the detected peak voltage is connected to the first terminal of capacitor 216. Resistor 218 and capacitor 216 are together configured as an RC circuit with a time constant small enough to ensure that the voltage across capacitor 216 can follow the signaling transitions inserted onto the line voltage, but also large enough to filter out noise spikes so that a clean signal may be passed on to the resistive divider including resistors 218 and 220 and subsequently to waveform discriminator 230. The divided voltage at the midpoint of the resistive divider including resistors 218 and 220 drives n-channel FET 226 on and off. The ratio of resistors 218 and 220 are set such that during normal operation when the nominal line voltage is provided along cable 112, the divided voltage at the midpoint between resistors 218 and 220 maintains n-channel FET 226 on, so that input terminal IN of waveform discriminator 230 is connected to the ground node. When the line voltage drops to the level of the signaling voltage, the divided voltage at the midpoint of resistors 218 and 220 is unable to keep n-channel FET 226 on, so that input terminal IN of waveform discriminator 230 is connected to a higher first voltage relative to ground. In other embodiments, a resistor may be inserted between the drain of n-channel FET 226 and the power supply of waveform discriminator 230. This interconnection will pull the drain of n-channel FET 226 high. In this way, a defined "high" being the power supply voltage and a defined "low" being the ground voltage may be presented to input terminal IN of waveform discriminator 230.

Waveform discriminator 230 is configured to detect the signaling transitions inserted onto the line voltage responsive to the voltage level changes at input terminal IN, to count and determine the length of the time intervals between successively detected signaling transitions, and to recognize receipt of the first and second transitions responsive to the detected time intervals. Waveform discriminator 230 enters the signaling mode responsive to the first transitions. Waveform discriminator 230 is further configured to detect the time interval Δt indicative of the desired dimming level responsive to the second voltage transition, and to either generate and output the dimming control signal to power converter 240 via output terminal C or enter the standby mode.

As described previously with respect to FIG. 1, AC line source 100 of lighting system 10 may provide a line voltage of 120 volts AC via cable 110 which is a two wire cable. Other lighting systems may be powered by a three-phase line source that provides a line voltage of 480 volts AC via a three wire cable. In such other lighting systems, the line voltage of one phase to ground is 277 volts AC. For the purposes of convenience and cost effectiveness, lighting driver 200 shown in FIG. 4 may be configurable to be operable responsive to a nominal line voltage (predetermined first line voltage) of 120 volts AC or a nominal line voltage (predetermined second line voltage) of 277 volts AC.

In greater detail, the detected peak voltage from diode 208 in lighting driver 200 shown in FIG. 4 is connected to the first terminal of resistor 210. The divided voltage at the midpoint of resistive divider including resistors 210 and 212 is connected to input terminal A/D of waveform discriminator 230. Waveform discriminator 230 is configured to detect whether the line voltage is 120 volts AC or 277 volts AC responsive to the voltage at input terminal A/D, and to provide switch signal s3 indicative of the detection result. When waveform discriminator 230 detects that the nominal line voltage is 277 volts AC, switch signal s3 is set to a high voltage level relative to ground to maintain n-channel FET 224 in an on state so that resistor 222 is connected to the resistive divider in parallel with resistor 220. When waveform discriminator 230 detects that the nominal line voltage is 120 volts AC, switch signal s3 is set to a low voltage level to maintain n-channel FET 224 in an off state so that resistor 222 is disconnected from the circuit. Resistor 222 is selected to have a resistance value so that when it is connected in parallel to resistor 220, the divided voltage at the midpoint of the voltage divider between resistors 218 and 220 when the nominal line voltage is 277 volts AC will be substantially the same as the divided voltage between resistors 218 and 220 when the nominal line voltage is 120 volts AC. N-channel FET 226 may thus be turned on at appropriate times responsive to applied voltage levels that are substantially the same regardless of whether the nominal line voltage is 120 volts AC or 277 volts AC, so that lighting driver 200 may be compatible for use with different nominal line voltages. In other embodiments, the value of resistor 222 may be selected to be compatible with nominal line voltages other than 277 volts AC.

Waveform discriminator 230 of lighting driver 200 shown in FIG. 4 may include a micro-controller, an ASIC, an FPGA, or any circuitry capable of detecting signaling transitions responsive to changes in voltage level at input terminal IN and detecting the time intervals between the transitions so as to correspondingly enter the signaling mode, generate the dimming control signal, and enter the standby mode. Waveform discriminator 230 may also include circuitry capable of detecting the voltage level at the input terminal A/D so as to generate switch signal s3. In some embodiments, waveform discriminator 230 may be programmable and may include a memory for storing software programming. In other embodiments, waveform discriminator 230 may be a micro-controller based circuit that is fast enough to detect the changes in voltage level of the divided voltage at the midpoint of the resistive divider including resistors 218 and 220, so that the divided voltage may be directly input to input terminal IN of waveform discriminator 230 and n-channel FET 226 may be omitted.

In further embodiments, the lighting units may be addressable responsive to the inserted transitions to selectively adjust dimming levels. For example, lighting driver 200 within lighting unit 120-3 may be addressable to enter the signaling mode responsive to the three first transitions at t1, t2 and t3 shown in FIG. 3, and lighting driver 200 within lighting unit 120-4 may be addressable to enter the signaling mode responsive to five first transitions, wherein each of the first transitions are separated from each other by the predetermined first time interval PT1. In other embodiments, lighting driver 200 within lighting unit 120-3 may be addressable to enter the signaling mode responsive to three first transitions that are separated from each other by predetermined first time interval PT1, and lighting driver 200 within lighting unit 120-4 may be addressable to enter the signaling mode responsive to three first transitions that are separated from each other by a predetermined time interval different than predetermined first time interval PT1. The lighting units may be grouped together to be addressable responsive to different respective sets of first transitions. Switch controller 134 shown in FIG. 2 may be configured or programmed to provide switch signals s1 and s2 at timings necessary to achieve addressability.

Figure 5:
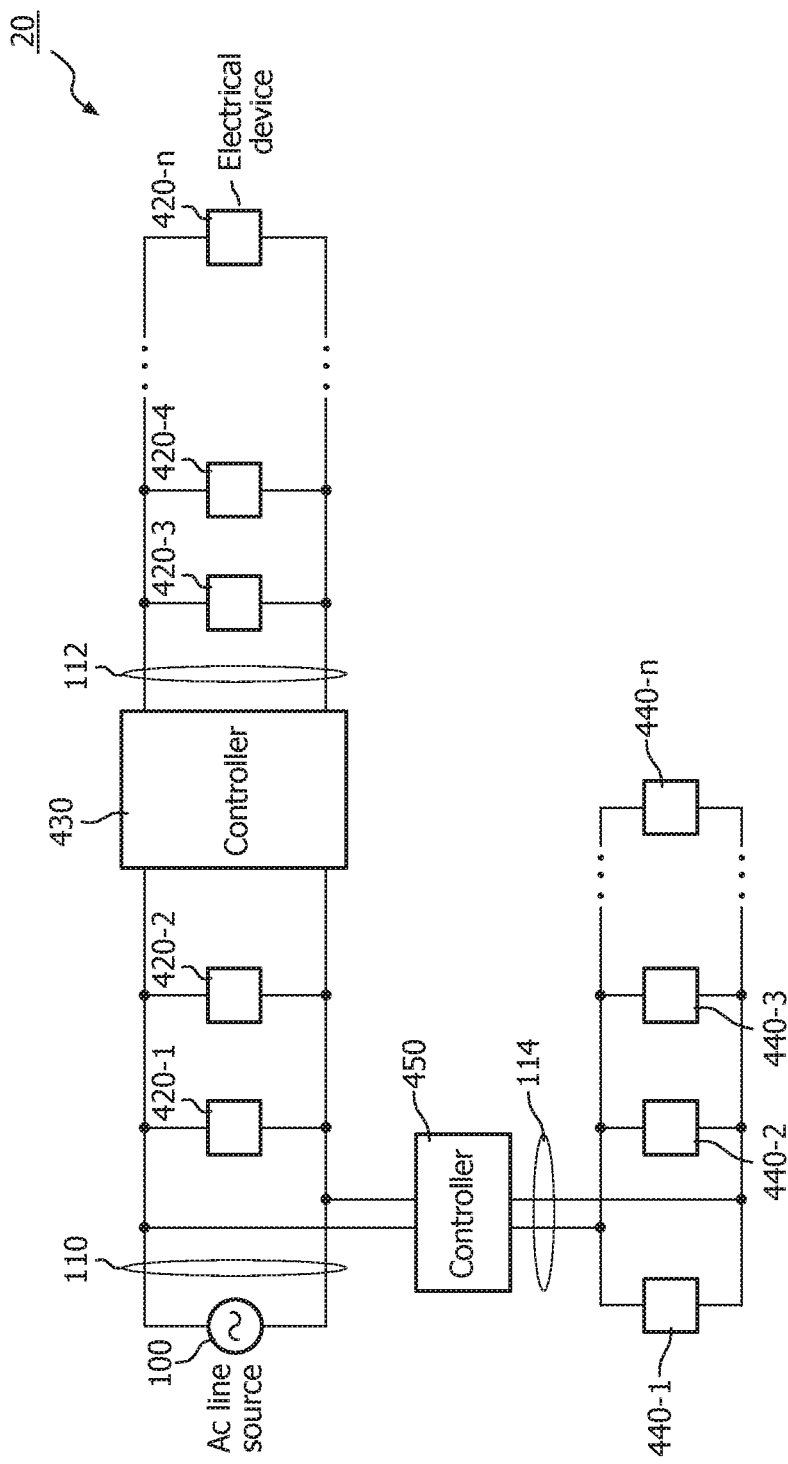
FIG. 5 illustrates an example embodiment of a system that controls load shedding of electrical devices.

FIG. 5 illustrates an example embodiment of a system that controls load shedding of electrical devices. System 20 includes AC line source 100 which may be connected to a plurality of electrical devices 420-1 and 420-2 and controllers 430 and 450 by a cable 110 consisting of two wires. Controller 430 may be connected to a plurality of electrical devices 420-3, 420-4, . . . 420-n via cable 112 which may consist of two wires. Controller 450 may be connected to a plurality of electrical devices 440-1, 440-2, 440-3, . . . 440-n by a cable 114 which may consist of two wires. AC line source 100 may be mains voltage. The electrical devices may include electrical loads such as air conditioning units, heating units, blowers, fans, or any other electrical load, and may each include a load driver for driving the electrical load. In a similar manner as in lighting system 10 shown in FIG. 1, controllers 430 and 450 insert bursts of signaling transitions that transition between a nominal line voltage and a signaling voltage onto the line voltage provided from AC line source 100 via cable 110, to control load shedding of the loads in the subsequently disposed electrical devices. Although only two controllers 430 and 450 are shown in FIG. 5, a plurality of additional controllers may be disposed to control various other electrical devices and in various other configurations. The electrical devices may be disposed within various rooms or areas of an indoor facility, or at various locations in an outdoor facility. Controllers 430 and 450 may be disposed at various locations within the facilities, at various control locations, or at a central control location.

Figure 6:
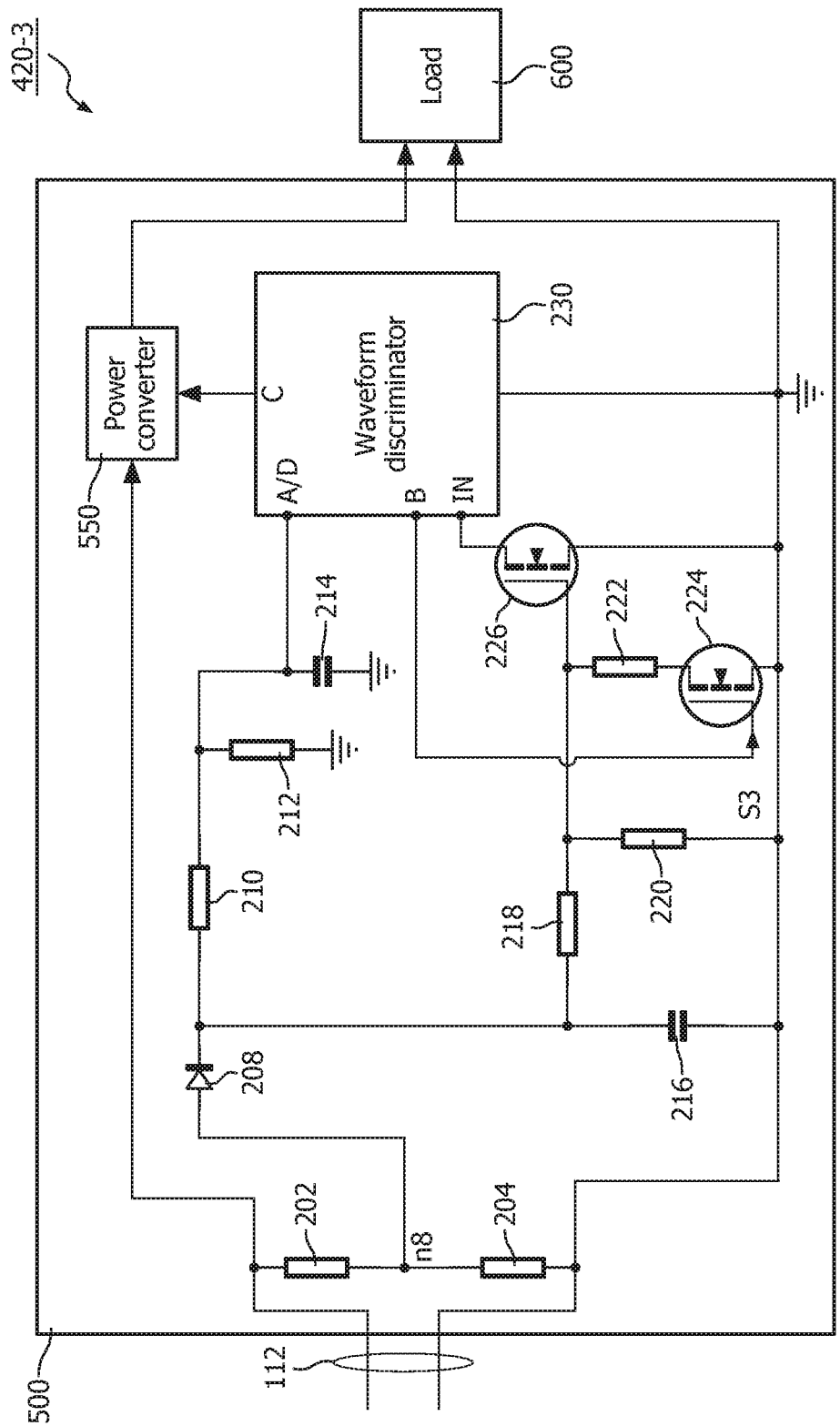
FIG. 6 illustrates an example embodiment of an electrical device.

FIG. 6 illustrates an example embodiment of an electrical device of system 20. Electrical device 420-3 shown in FIG. 6 may be representative of any of electrical devices 420-1-420-n and 440-1-440-n in system 20 shown in FIG. 5, and includes load driver 500 and electrical load 600. Load drivers 500 may be configured in a similar manner as lighting driver 200 shown in FIG. 4, to detect signaling transitions inserted on the line voltage. The inserted signaling transitions are of the form described with respect to FIG. 3. In FIG. 6, circuit elements that are the same as in FIG. 4 have the same respective reference numerals, and description of such same circuit elements may be omitted from the following for the sake of brevity.

Load driver 500 as shown in FIG. 6 is configured in a similar manner as lighting driver 200 shown in FIG. 4, except for the following. Since electrical loads 600 may be an air conditioning unit, heating unit, blower, or fan driven by AC line voltage, load driver 500 does not include a full wave bridge rectifier. Waveform discriminator 230 may be configured similarly as described with respect to FIG. 4 to generate and provide a load shedding signal to power converter 550 via output terminal C responsive to the voltage level at input terminal IN. Power converter 550 is connected to a first wire of cable 112 and adjusts the amount of current driven into electrical load 600 responsive to the load shedding signal, to control load shedding of electrical load 600. The load shedding signal may automatically control the cooling rate of an air conditioning unit, the heating rate of a heating unit, and/or the speed of a blower or a fan during off peak hours for instance, to conserve energy. Waveform discriminator 230 may be configured similarly as variously described previously to enter a signaling mode, to enter a standby mode, and to be responsive to a nominal line voltage of 120 volts AC or a nominal line voltage of 277 volts AC.

In other embodiments, the concepts as described with respect to FIGS. 1-4 may be used in retrofit applications to provide existing lighting systems or installations with cost effective dimming level control, without the necessity of running additional control wiring and/or extensive infrastructure. For example, in an embodiment where an existing lighting system including lighting units mounted on light poles at various locations along one or more streets, one or more controllers 130 such as described with respect to FIG. 2 may be interconnected into the existing two wire cable feeding line voltage to the light poles, to insert signaling transitions onto the line voltage. Controllers 130 may be configurable as connectable to an existing cable disposed between a line voltage source and at least one lighting unit. One or more of the existing lighting units may be retrofit to replace a legacy lighting driver with a retrofit lighting driver such as lighting driver 200 such as described with respect to FIG. 4 directly connected to the existing two wire cable and the light source within the existing lighting unit, to control the dimming level of the lighting unit and/or enable provision of a standby mode responsive to the inserted signaling transitions. In the alternative, one or more of the existing lighting units may be retrofit to replace a legacy lighting driver with a retrofit lighting driver similar to load driver 500 described with respect to FIG. 6. In other embodiments, one or more of the existing lighting units may be retrofit to respectively replace a legacy lighting driver and a legacy lighting source with a retrofit lighting driver such as lighting driver 200 and a retrofit lighting source such as lighting source 300 described with respect to FIG. 4. In a similar manner, the concepts as described with respect to FIGS. 5-6 may be used in retrofit applications to provide existing air conditioning and/or heating systems or installations with load shedding control, also without the necessity of running additional control wiring and/or adding extensive infrastructure.

In a still further embodiment, lighting system 10 shown in FIG. 1 may be configured to provide a DC line voltage having signaling transitions inserted thereon to control dimming level of the lighting fixtures. For example, instead of an AC line source, the lighting system may be connected to a DC line source that provides a line voltage of 250 volts DC or 480 volts DC. In other embodiments, instead of including autotransformer 132 and switches SW1 and SW2, controller 130 as shown in FIG. 2 may include an AC-DC DC-DC converter connected to the AC line voltage provided along cable 110. The AC-DC DC-DC converter may be configured to output a line voltage of 480 volts DC along cable 112 and to insert signaling transitions at a signaling voltage onto the output line voltage responsive to timing signals provided by switch controller 134. VDR 136 would be unnecessary in this and omitted in this embodiment. A lighting such as configured in load driver 500 shown in FIG. 6 may be used to detect the signaling transitions and provide a dimming control signal to power converter 550 to adjust the amount of current provided to a corresponding lighting source. In further embodiments, such a lighting system may be used to control dimming levels of 12 volt or 24 volt DC lighting systems.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B")

can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

The invention claimed is:

1. A controller for inserting signaling transitions onto a line voltage to be received by an electrical device connected to the line voltage, comprising:
   an auto-transformer having first and second end terminals, and configured to include a first winding portion connected between the first end terminal and a transformer tap, and a second winding portion connected between the transformer tap and the second end terminal, the first and second end terminals connected to the line voltage;
   a first switch having a first switch terminal connected to the first end terminal of the auto-transformer, and a second switch terminal connected to an output node of the controller;
   a second switch having a first switch terminal connected to the transformer tap of the auto-transformer, and a second switch terminal connected to the output node; and
   a switch controller configured to output first and second switch signals responsive to a control signal, to control the first and second switches to insert the signaling transitions onto the line voltage by selectively connecting a nominal line voltage at the first end terminal and a signaling voltage at the transformer tap to the output node, the difference between the nominal line voltage and the signaling voltage being distinguishable over nominal line voltage fluctuations, and the signaling voltage being greater than a drop-out voltage of the electrical device,
   wherein the switch controller is further configured to output the first and second switch signals to control the first and second switches to insert a second signaling transition after a plurality of first signaling transitions, a time interval between the second signaling transition and a last of the first signaling transitions (i) being set responsive to a value of the control signal and (ii) corresponding to an action for the electrical device, the electrical device being configured to detect the signaling transitions and perform the action in response to the signaling transitions.

2. The controller of claim 1, further comprising a receiver configured to receive a wireless signal, and to output the control signal responsive to the wireless signal.

3. The controller of claim 2, wherein the wireless signal comprises is a radio frequency (RF) signal, a general packet radio service (GPRS) signal, or an optical signal.

4. The controller of claim 1, further comprising a voltage dependent resistor (VDR) connected across the output node and the second end terminal of the auto-transformer.

5. The controller of claim 1, wherein the controller is hardwired to directly receive the control signal.

6. The controller of claim 1, wherein the first and second switches comprise relays, thyristors or insulated gate bipolar transistors (IGBTs).

7. The controller of claim 1, wherein the signaling voltage is fixed within a range of about 90%-95% of the nominal line voltage.

8. The controller of claim 1, wherein the plurality of first signaling transitions indicate the start of a signaling mode, and the plurality of first signaling transitions having have a predetermined first time interval between each other.

9. A lighting system comprising:
   a controller connected to a line voltage via an input node and an output node, the controller configured to insert signaling transitions that transition between a nominal line voltage from the input node and a signaling voltage created by the controller onto the line voltage via the output node responsive to an external control signal received by the controller, the controller inserting the signaling transitions by selectively connecting to the output node the nominal line voltage and the signaling voltage; and
   at least one lighting unit connected to the line voltage having the inserted signaling transitions, and configured to control dimming level of emitted light responsive to the signaling transitions,
   wherein the controller is configured to insert a second signaling transition after a plurality of first signaling transitions, a time interval between the second signaling transition and a last of the first signaling transitions (i) being set responsive to a value of the control signal and (ii) corresponding to a dimming level for the at least one lighting unit, and wherein the difference between the nominal line voltage and the signaling voltage is distinguishable over nominal line voltage fluctuations, and the signaling voltage is greater than a drop-out voltage of the at least one lighting unit.

10. The lighting system of claim 9, wherein the plurality of first signaling transitions indicate the start of a signaling mode, the plurality of first signaling transitions having a predetermined first time interval between each other.

11. The lighting system of claim 10, wherein the controller is configured to insert the second signaling transition at a predetermined second time interval after the last of the first signaling transitions to set a standby mode, and the at least one lighting unit is configured to emit no light during the standby mode.

12. The lighting system of claim 9, wherein the signaling voltage is fixed within a range of about 90%-95% of the nominal line voltage.

13. The lighting system of claim 9, further comprising a line voltage source, wherein the controller is configured as connected to an existing cable disposed between the line voltage source and the at least one lighting unit.

14. The lighting system of claim 9, wherein the controller comprises a receiver configured to receive a wireless signal, and to output the control signal responsive to the wireless signal.

15. A controller for inserting signaling transitions onto a line voltage to be received by at least one lighting unit connected to the line voltage, comprising:
   an auto-transformer connected to the line voltage, and configured to respectively provide a nominal line voltage and a signaling voltage at a first end terminal and a transformer tap, the difference between the nominal line voltage and the signaling voltage being distinguishable over nominal line voltage fluctuations, and the signaling voltage being greater than a drop-out voltage of the at least one lighting unit;
   a switch connected between the auto-transformer and an output node of the controller; and a switch controller configured to control the switch to insert the signaling transitions onto the line voltage by selectively connecting the nominal line voltage at the first end terminal and the signaling voltage at the transformer tap to the output node, the signaling transitions including a plurality of first signaling transitions having a predetermined first time interval between each other that set the start of a signaling mode, and a second signaling transition after the plurality of first signaling transitions, a time interval between the second signaling transition and a last of the plurality of first signaling transitions set responsive to a value of the control signal and corresponding to a dimming level to control dimming of the at least one lighting unit.

16. The controller of claim 15, wherein the time interval is within a range of about 200 msecs to 400 msecs.

17. The controller of claim 15, wherein the signaling voltage is fixed within a range of about 90%-95% of the nominal line voltage.

18. The controller of claim 15, wherein the switch controller is further configured to control the switch to insert the second signaling transition at a predetermined second time interval after the last of the plurality of first signaling transitions to set a standby mode that controls the at least one lighting unit to emit no light.

19. The controller of claim 15, wherein the switch controller comprises a receiver configured to receive a wireless signal, and to output the control signal responsive to the wireless signal.

20. The controller of claim 15, wherein the controller is hardwired to directly receive the control signal.

* * * * *